(12) United States Patent
Moffitt

(10) Patent No.: US 8,261,216 B2
(45) Date of Patent: Sep. 4, 2012

(54) AUTOMATED PLANNING IN PHYSICAL SYNTHESIS

(75) Inventor: Michael David Moffitt, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 12/855,009

(22) Filed: Aug. 12, 2010

(65) Prior Publication Data
US 2012/0042295 A1    Feb. 16, 2012

(51) Int. Cl.
*G06F 17/50* (2006.01)

(52) U.S. Cl. ........ 716/104; 716/100; 716/101; 716/106; 716/110; 716/111

(58) Field of Classification Search .................. 716/100, 716/101, 103, 104, 106, 110, 111, 132
See application file for complete search history.

(56) References Cited

U.S. PATENT DOCUMENTS

| | | | |
|---|---|---|---|
| 3,777,129 A * | 12/1973 | Mehta ........................... | 716/136 |
| 6,185,707 B1 * | 2/2001 | Smith et al. ................... | 714/724 |
| 6,553,554 B1 * | 4/2003 | Dahl et al. ..................... | 716/119 |
| 6,574,788 B1 * | 6/2003 | Levine et al. .................. | 716/102 |
| 7,146,586 B2 * | 12/2006 | Bohl et al. ..................... | 716/136 |
| 7,526,740 B2 * | 4/2009 | Bohl et al. ..................... | 716/136 |
| 8,104,015 B2 * | 1/2012 | Bohl et al. ..................... | 716/136 |
| 2002/0093525 A1 * | 7/2002 | Asauchi ........................ | 345/714 |
| 2002/0166082 A1 * | 11/2002 | Ramadei et al. ............... | 714/37 |
| 2006/0149506 A1 | 7/2006 | Cutuli et al. | |
| 2009/0292383 A1 | 11/2009 | Bohl et al. | |

* cited by examiner

*Primary Examiner* — Sun Lin
(74) *Attorney, Agent, or Firm* — Garg Law Firm, PLLC; Rakesh Garg; Libby Z. Toub

(57) ABSTRACT

A method, system, and computer usable program product for automated planning in physical synthesis are provided in the illustrative embodiments. A state of an integrated circuit design is identified where the state is a representation of a particular configuration of circuit components having a particular electrical characteristic. A first operation applicable to the first state is selected and applied to reach a second state of the design. A consequence of reaching the second state is analyzed. If the consequence indicates an improvement in the design, a solution is presented to achieve the improvement. The solution includes manipulations of design components using a set of operations to reach the second state from the first state.

20 Claims, 4 Drawing Sheets

AUTOMATED PLANNING IN PHYSICAL SYNTHESIS

BACKGROUND OF THE INVENTION

1. Field of the Invention

The present invention relates generally to an improved data processing system, and in particular, to a computer implemented method for integrated circuit design. Still more particularly, the present invention relates to a computer implemented method, system, and computer usable program code for automated planning in the physical synthesis process of integrated circuit (IC) design.

2. Description of the Related Art

Modern day electronics include components that use integrated circuits. Integrated circuits are electronic circuits formed using Silicon as a substrate and by adding impurities to form solid-state electronic devices, such as transistors, diodes, and resistors. Commonly known as a "chip", an integrated circuit is generally encased in hard plastic. The components in modern day electronics generally appear to be rectangular black plastic pellets with connector pins protruding from the plastic encasement.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

Logical synthesis, physical synthesis, and generation of a routed and timing closed design are some of the functions of an IC design software tool. Logical synthesis is the process of designing the logical operation that is to be achieved by a circuit. Physical synthesis is the mapping, translating, or integration of that logical synthesis to the physical design components, such as logic gate and buffer circuits. Routing and timing closed design is the design produced by adjusting the wire routings in and component placements in a design so that the design meets certain design criteria such as delay or slew of signals, or wirelength restrictions.

In physical synthesis, generally as a simulation in a design tool, components are placed and interconnected to determine the resulting circuit's characteristics. Components can be moved or changed if certain characteristics have to be altered. Some examples of problems solved during the physical synthesis process are determining the component to move or change, determining the components to add or delete, and determining the routes between components that require buffering.

SUMMARY OF THE INVENTION

The illustrative embodiments provide a method, system, and computer usable program product for automated planning in physical synthesis of an integrated circuit design. An embodiment identifies, in an application executing in a computer, a state of the design, where the state is a representation of a particular configuration of circuit components having a particular electrical characteristic. The embodiment selects from a library, a first operation applicable to the first state. The embodiment applies the first operation to reach a second state of the design. The embodiment analyzes a consequence of reaching the second state. In response to the consequence indicating an improvement in the design, the embodiment presents a solution to achieve the improvement. The solution includes manipulations of design components using a set of operations to reach the second state from the first state.

BRIEF DESCRIPTION OF THE DRAWINGS

The novel features believed characteristic of the invention are set forth in the appended claims. The invention itself; however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
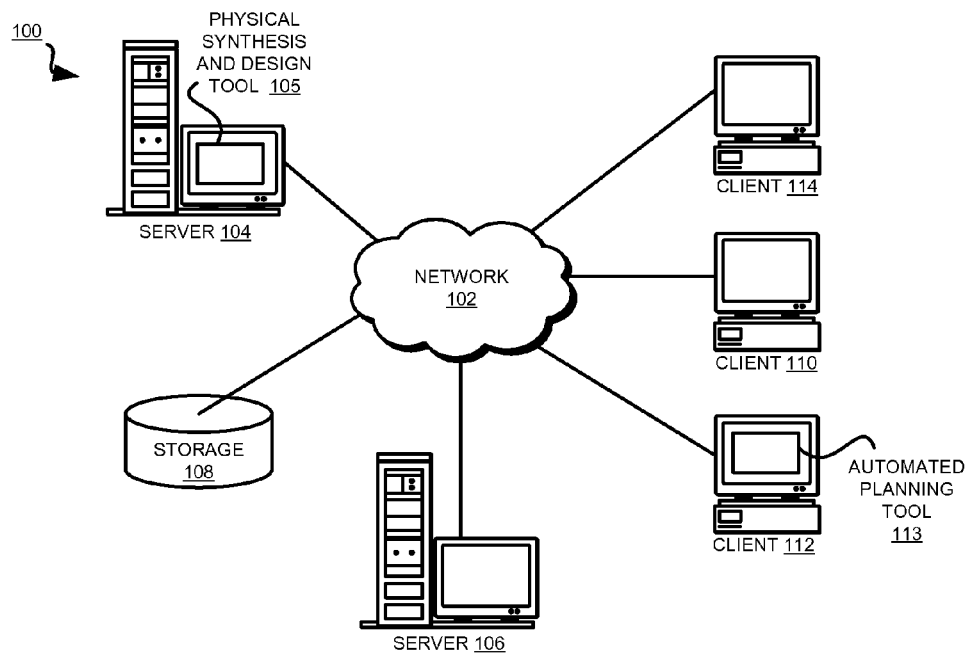
FIG. 1 depicts a pictorial representation of a network of data processing systems in which the illustrative embodiments may be implemented.

A goal of physical synthesis is to achieve design objectives through manipulation of components participating in the design. Presently in physical synthesis flows, a portion of the design, such as a small group of components, is manipulated in predetermined alternative ways and the resulting changes in the design characteristic are observed. From the various changes observed, a preferred or optimal solution for that portion of the design is identified. The preferred solution is fixed in the design, and another small group of components is manipulated in a similar manner.

The invention recognizes that such a method of local optimization may miss a superior solution, if one is available through deeper manipulations. For example, presently, a move of a component that degrades the quality of the portion of the design is rejected in the physical synthesis process. In other words, only those manipulations are considered which incrementally improve the quality of the design. The invention recognizes that while one manipulation may degrade the quality of the portion of the design, that manipulation in combination with several other subsequent manipulations may in fact yield a superior result, as compared to when the degrading manipulation is immediately discarded.

The invention further recognizes that often, manipulation of one component alters the behavior of another component or portion of the design. The invention recognizes that some of the effects of manipulating a component are not immediately apparent unless the manipulation is performed in combination with certain other manipulations. The consequences of a manipulation are sometimes apparent with a delay, such as after the manipulation is fixed, even if the manipulation degrades the quality of the design, and subsequent measurements or manipulations are performed elsewhere in the design.

Furthermore, the invention recognizes that a local refinement or improvement in a portion of the design may actually degrade the quality of the overall design. Presently used physical synthesis processes achieve poor global refinement due to the focus on local optimization.

The illustrative embodiments used to describe the invention generally address and solve the above-described problems and other problems related to currently used physical synthesis process. The illustrative embodiments of the invention provide a method, computer usable program product, and data processing system for automated planning in physical synthesis.

An embodiment of the invention regards physical synthesis problems not only as an optimization problem alone but also as a planning problem. An embodiment applies the automated planning process, as developed in the artificial intelligence art, to solve the optimization problems encountered in physical synthesis. In other words, an embodiment can be regarded as an expert system for solving physical synthesis problems, the operation of which will become clear from the following description.

The illustrative embodiments are described with respect to data, data structures, and identifiers only as examples. Such descriptions are not intended to be limiting on the invention. Furthermore, the illustrative embodiments may be implemented with respect to any type of data processing system. For example, an illustrative embodiment may be implemented with respect to any type of client system, server system, platform, or a combination thereof.

The illustrative embodiments are further described with respect to certain parameters, attributes, operations, manipulations, and configurations only as examples. Such descriptions are not intended to be limiting on the invention. For example, an illustrative embodiment described with respect to a particular example operation can be similarly implemented using other operations as may be available in a given library, in a similar manner within the scope of the invention.

An application implementing an embodiment may take the form of data objects, code objects, encapsulated instructions, application fragments, drivers, routines, services, systems—including basic I/O system (BIOS), and other types of software implementations available in a data processing environment. For example, Java® Virtual Machine (JVM®), Java® object, an Enterprise Java Bean (EJB®), a servlet, or an applet may be manifestations of an application with respect to which, within which, or using which, the invention may be implemented. (Java, JVM, EJB, and other Java related terminologies are registered trademarks of Sun Microsystems, Inc. in the United States and other countries.)

An illustrative embodiment may be implemented in hardware, software, or a combination thereof. The examples in this disclosure are used only for the clarity of the description and are not limiting on the illustrative embodiments. Additional or different information, data, operations, actions, tasks, activities, and manipulations will be conceivable from this disclosure for similar purpose and the same are contemplated within the scope of the illustrative embodiments.

The illustrative embodiments are described using specific code, file systems, designs, architectures, layouts, schematics, and tools only as examples and are not limiting on the illustrative embodiments. Furthermore, the illustrative embodiments are described in some instances using particular data processing environments, such as a helpdesk environment, only as an example for the clarity of the description. The illustrative embodiments may be used in conjunction with other comparable or similarly purposed structures, systems, applications, or architectures.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 2:
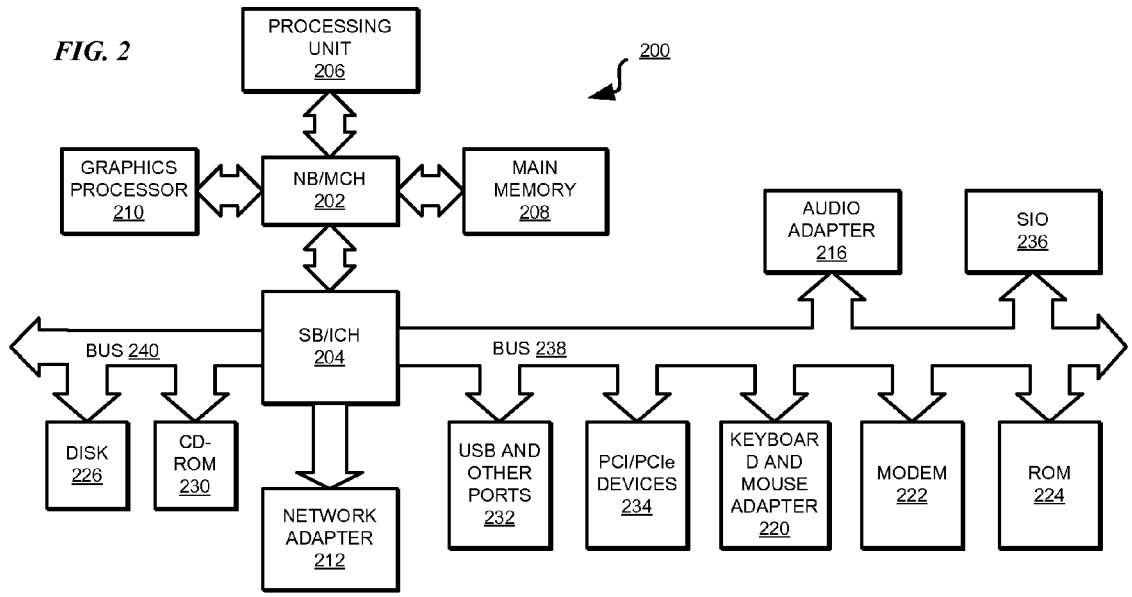
FIG. 2 depicts a block diagram of a data processing system in which the illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

Server 104 may include design tool 105. Design tool 105 may be an IC design application capable of executing the physical synthesis process. Client 112 may include automated planning tool 113. Automated planning tool 113 may be an application according to an embodiment of the invention.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client server environment in which the illustrative embodiments may be implemented. A client server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, in which computer usable program code or instructions implementing the processes may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations. In some configurations, processing unit 206 may include NB/MCH 202 or parts thereof.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). In some configurations, ROM 224 may be an Electrically Erasable Programmable Read-Only Memory (EEPROM) or any other similarly usable device. Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), or Linux® (Linux is a trademark of Linus Torvalds in the United States and other countries). An object oriented programming system, such as the Java® programming system, may run in conjunction with the operating system and provides calls to the operating system from Java® programs or applications executing on data processing system 200 (Java is a trademark of Sun Microsystems, Inc., in the United States and other countries).

Instructions for the operating system, the object-oriented programming system, and applications or programs are located on storage devices, such as hard disk drive 226, and may be loaded into main memory 208 for execution by processing unit 206. The processes of the illustrative embodiments may be performed by processing unit 206 using computer implemented instructions, which may be located in a memory, such as, for example, main memory 208, read only memory 224, or in one or more peripheral devices.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

Figure 3:
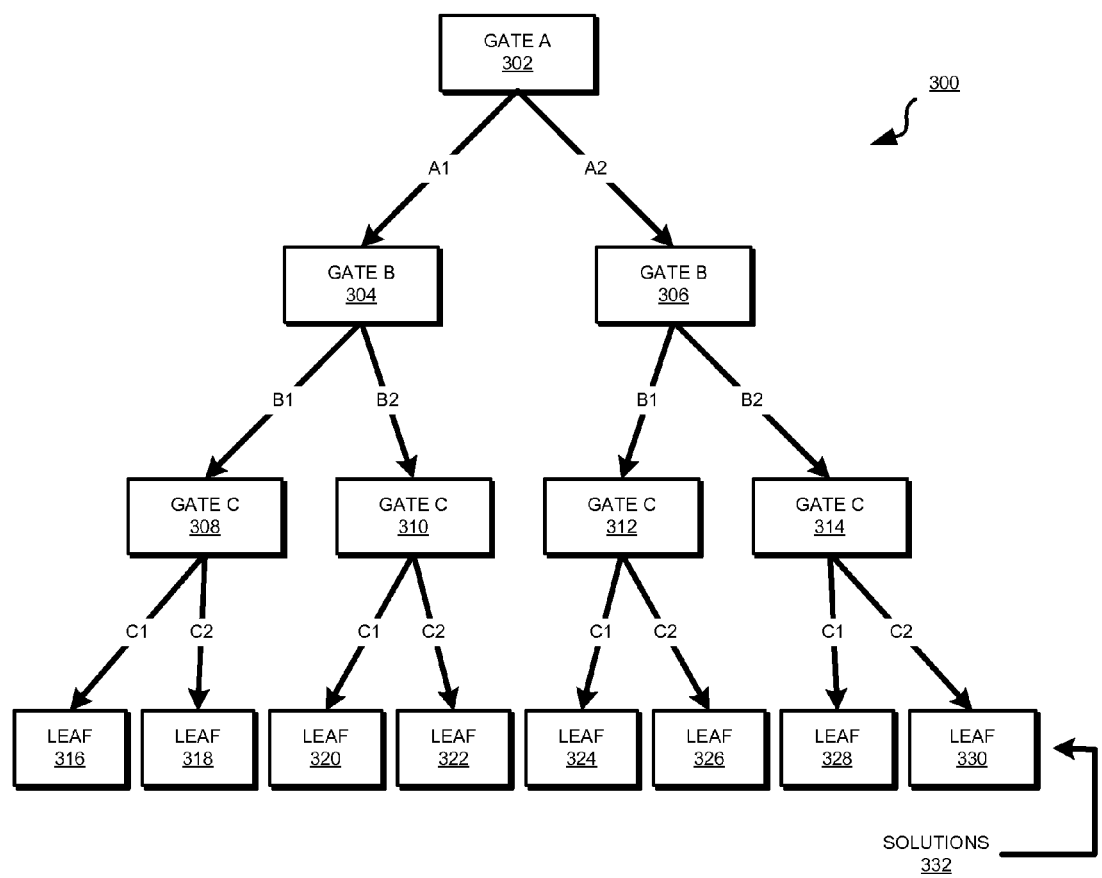
FIG. 3 depicts a block diagram of a prior art physical synthesis process that can be improved by an illustrative embodiment.

With reference to FIG. 3, this figure depicts a block diagram of a prior art physical synthesis process that can be improved by an illustrative embodiment. Process 300 is a Simultaneous Optimization process implemented in design tool 105 in FIG. 1. Simultaneous Optimization process examines possible solutions for optimizing a small group of components in a portion of a design.

In this process, some components, such as gates A, B, and C in a design, may be regarded as a small local group suitable for local optimization. Each component may have a predetermined manipulation that may be performed on that component. For example, a gate may be moved to a different location, or buffered in the design. Importantly, the manipulations available for a component have to be predetermined before the simultaneous optimization process begins, and a manipulation cannot be added or modified for a component on the fly during the execution of the process.

As an example to illustrate the deficiencies of this method, in the illustration of FIG. 3, gate A is a candidate component, having predetermined manipulations A1 and A2 that are possible on that component. Gate B is another candidate component, having predetermined manipulations B1 and B2 that are possible on that component. Gate C is another candidate component, having predetermined manipulations C1 and C2 that are possible on that component.

In operation, simultaneous optimization process computes all possible combinations of the possible operations on all components in the local group. For example, process 300 may perform operation A1 on gate A 302, followed by all operations on gate B 304, to wit, B1 and B2. For each operation B1 and B2, process 300 computes all operations on gate C 308 and 310 respectively.

Similarly, starting at gate A 302 again, process 300 may perform operation A2 on gate A 302, followed by all operations on gate B 306, to wit, B1 and B2. For each operation B1 and B2, process 300 computes all operations on gate C 312 and 314 respectively.

Computing in this manner for exploring all possible combinations of predetermined operations on a small local group, process 300 computes the qualitative characteristics of the resulting solutions when leaves 316, 318, 320, 322, 324, 326, 328, and 330 are reaches at the end of the computation. Leaves 316-330 represent the various combinatorial solutions in the local group of gates A, B, and C.

The invention recognizes that by being limited to the enumerated one, two, or more operations defined for each component in a small local group of components, process 300 suffers from several drawbacks. For example, the search for solutions in process 300 is not trying any solution that is not already anticipated at the beginning of the process. For example, only manipulations C1 and C2 will be possible on gate C regardless of when those manipulations are performed in the process. Process 300 will never attempt a manipulation C3 if an opportunity for C3 should present itself in the design. Similarly, a buffer D cannot be introduced mid-process, unless buffer D is specifically enumerated as a component in the local group before process 300 begins.

Further, the depth of the tree depicted in FIG. 3 is limited by the exploding number of solutions. In other words, the number of components and the number of manipulations thereon both have to be limited such that process 300 does not consume significant computational resources, including time, to produce the solution options.

Additionally, some of the solutions reached in process 300, for example, certain leaves, may not be practicable solutions for a variety of reasons. In other words, even though the combination of operation A1, B2, and C1 is computationally possible, the resulting design alterations may be known to be unacceptable for some reasons. Process 300 cannot be limited to selectively prune certain solutions because process 300 progresses simply by exploring combinations, not based on any characteristics of the state of the design reached at intermediate points in the process.

Therefore, the prior art physical synthesis process using simultaneous optimization or another presently used method fails to detect and resolve a problem that may arise by a manipulation. In other words, prior art physical synthesis is deficient in providing on-the-fly analysis and resolution of consequential design problems resulting from a combination of manipulations. Various embodiments of the invention may be implemented in conjunction with an existing design tool to overcome these and other deficiencies of prior art physical synthesis process.

Figure 4:
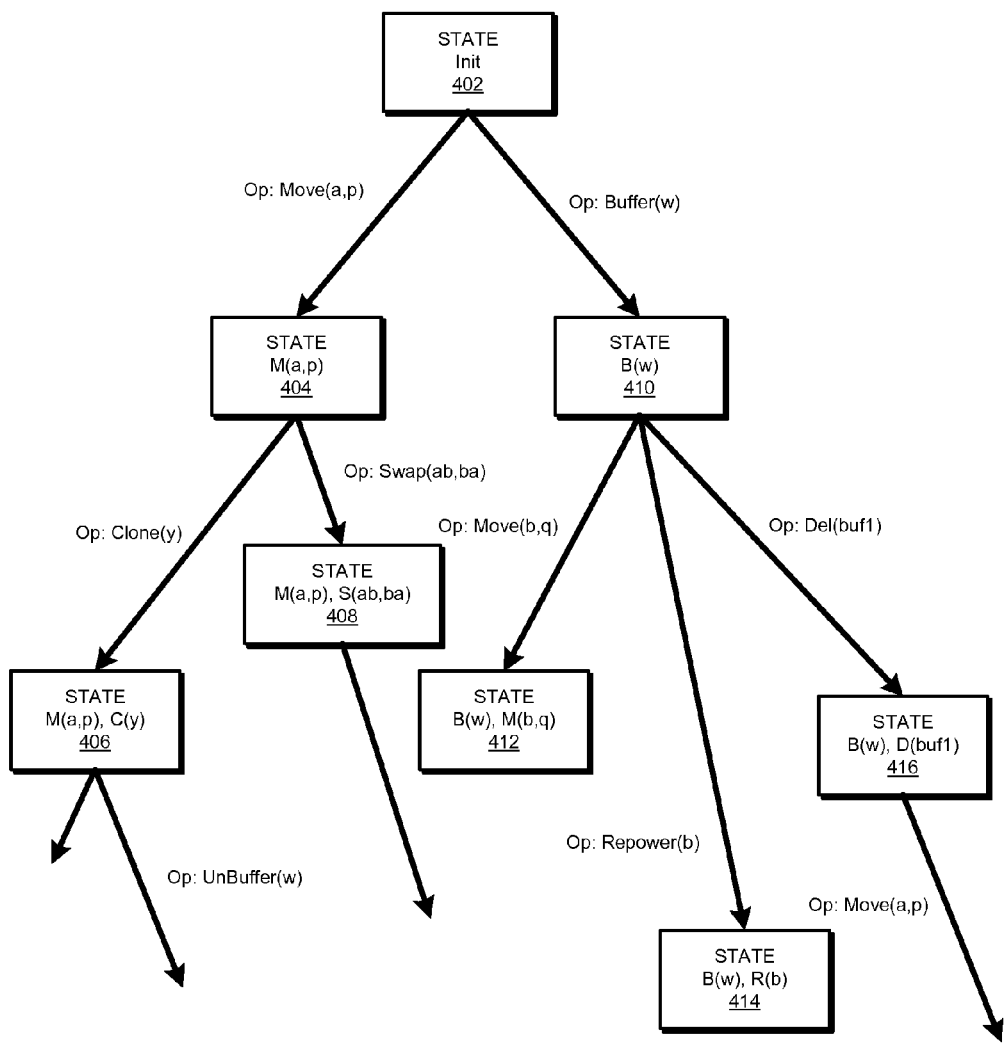
FIG. 4 depicts a block diagram of an automated planning based physical synthesis process in accordance with an illustrative embodiment.

With reference to FIG. 4, this figure depicts a block diagram of an automated planning based physical synthesis process in accordance with an illustrative embodiment. Process 400 can be implemented in automated planning tool 113 in FIG. 1. Process 400 can also be implemented to operate in design tool 105 in FIG. 1.

In contrast with process 300 in FIG. 3, process 400 begins at a state of a design or portion thereof. For example, a state of a design may represent the design having certain components located in certain positions and exhibiting certain characteristics, such as signal delays; the design exhibiting certain characteristics as a consequence, such as overall delay or slew at a given point in the design, or having a certain wirelength or congestion.

A library of operations is made available to process 400. The library includes a set of manipulations permissible on the collection of components in the design. For example, in the nomenclature of FIG. 3, the library may include manipulations A1, A2, B1, B2, C1, C2, and C3 without limiting any particular manipulation to any particular component. As process 400 progresses, the design reaches different states, with process 400 deciding which manipulation to try at any given state.

A manipulation may be selected from the library according to any rule or preference. A state reached during the execution of process 400 may be analyzed for the consequences of reaching that state. For example, once a state is reached, a consequence of that state may be that a signal is slewed beyond tolerance at another point in the design.

As another example, a consequence of a state may be that a number of buffers exceeding a threshold number have to be placed in a cell of the design for maintaining the timing characteristics of a signal in another part of the design. Upon analysis of the consequences at a state of the design, process 400 may be able to retract from a sequence of manipulations and try other manipulations to avoid undesirable consequences.

An example operation of process 400 is depicted in FIG. 4. Beginning at state "init" 402, process 400 may decide to apply a move operation on component "a" to a point "p" in the design. By computing this move(a, p)operation, process 400 determines that the design reaches state 404 where operation move(a, p) has been applied to state 400.

Upon analysis of the consequences of state 404, process 400 may determine that a clone operation on component "y" or a swap of component "a" for component "b" might result in qualitative improvement of the design. Accordingly, process 400 tries the clone(y) operation to reach state 406, and tries the swap(ab, ba) operation to reach state 408. Following the analysis of states 406 and 408, process 400 may decide to further pursue additional operations on one, both, or none of those states.

Similarly, by returning or retracting to state 402, or by an alternative beginning from state 402, process 400 may decide to insert a buffer "w" to reach state 410. Upon applying buffer(w) operation to reach state 410, process 400 analyzes the consequences of state 410 to determine whether to retract from state 410 or proceed deeper using another operator. For example, process 400 may decide to try three different alternatives from state 410.

In one alternative, process 400 may move buffer "b" to a position "q" by a move(b, q) operation to reach state 412. In another alternative, process 400 may repower buffer "b" by a repower(b) operation to reach state 414. In another alternative, process 400 may delete buffer "buf1" by a del(buf1) operation to reach state 416.

Upon analysis of states 412, 414, and 416, process 400 conclude that states 412 and 414 are practically unreachable in manufacturing, violate a design parameter, or have some undesirable consequence in the design. Accordingly, process 400 may decide to retract from states 412 and 414 and pursue state 416 further with additional operations. For example, process 400 may move buffer "ba to a position "p" by a move(a, p) operation to reach a state beyond state 416.

As is evident from this description and the depiction of FIG. 4, process 400 is limited neither in the number of components nor in manipulations. Furthermore, process 400 is not limited by a priori enumeration of components or operations that can participate in process 400. A component or operation can be introduced during the execution of process 400 to explore possible states of the design.

Additionally, because process 400 can analyze the state and the state's consequences, the process can retreat from an undesirable state. The retreat or retraction mechanism allows process 400 to explore useful states deeper, with more possible manipulations. The deeper exploration of process 400 may uncover viable and desirable solutions that may include some deteriorating manipulations but overall provide improved design characteristics.

The selection and application of manipulations from the library, reaching a state, retraction from a state, and avoiding certain states or combinations of manipulations all together, may be configurable. For example, process 400 may be executed in an iterative deepening mode or look ahead mode.

Furthermore, each of these choices of manipulations and traversals may be made conditional (or contingent) upon the observation of a given state. A choice option may be chosen dynamically by the process based on the circumstances, state observations, and availability of choices at a given time, as opposed to a static specification of choices for certain conditions.

Figure 5:
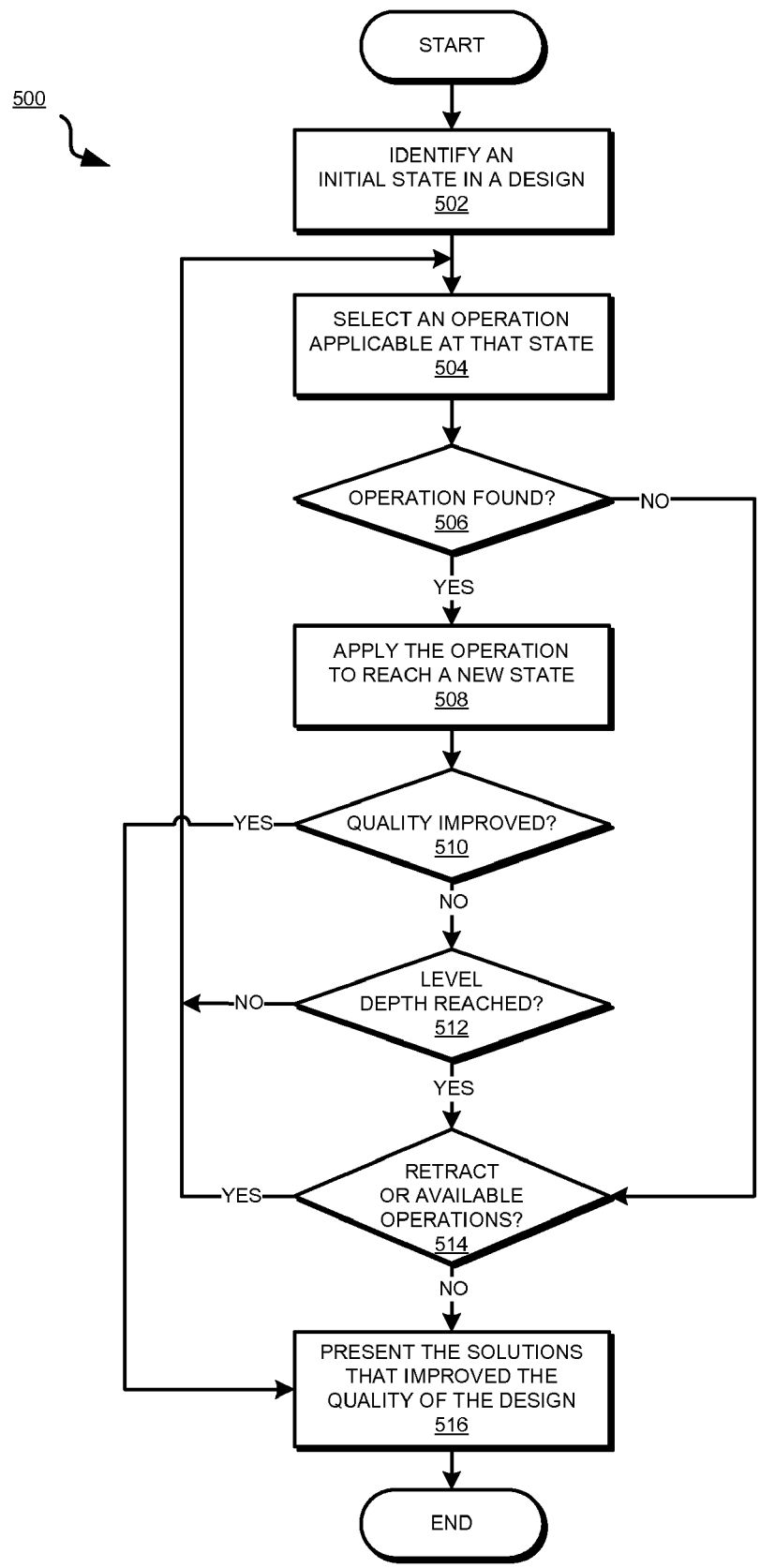
FIG. 5 depicts a flowchart of automated planning in an improved physical synthesis process in accordance with an illustrative embodiment.

With reference to FIG. 5, this figure depicts a flowchart of automated planning in an improved physical synthesis process in accordance with an illustrative embodiment. Process 500 may be implemented in design tool 105 or automated planning tool 113 in FIG. 1.

Process 500 begins by identifying an initial state in a design (step 502). Process 500 tries to select from a library an operation that is applicable at that state (step 504).

Process 500 determines whether a suitable operation was found (step 506). If an operation was found ("Yes" path of step 506), process 500 applies the operation to reach a new state (step 508).

Process 500 may determine whether the quality of the design has improved (step 510). Note that step 510 may not be executed at each step but when certain states are reached after a combination of operations. The quality improvement determination may include improvement of any qualitative feature of the design, such as improved timing, wirelength, congestion, straightening, reduction in scenic routes, or reduction in the number of components.

If process 500 determines that quality has not improved ("No" path of step 510), process 500 may determine whether a predetermined level depth has been reached in the exploration of states (step 512). Level depth is a maximum number of operations allowed to occur in a sequence of operations. A maximum level depth or exploration depth may be set to ensure that the process does not go deep into impractical states through a long sequence of plausible manipulations. Process 500 may use such a depth limitation for making the determination of step 512.

If process 500 determines that the depth limitation has not been reached ("No" path of step 512), process 500 returns to step 504. If process 500 determines that the depth limitation has been reached ("Yes" path of step 512), process 500 determines whether to retract from the state or whether additional operations are available to reach another state at the then-current level (step 514).

If process 500 decides to retract, or if additional operations are available ("Yes" path of step 514), process 500 returns to step 504. If no operation is found in step 506 ("No" path of step 506), process may reach step 514 as well.

If process 500 decides not to retract, or if no operation is available ("No" path of step 514), process 500 presents the one or more solutions that improved some aspect of the quality of the design (step 516). Process 500 ends thereafter. If in step 510, process 500 determines that the quality has improved, such as to an predetermined quality improvement acceptance level of a design quality parameter ("Yes" path of step 510), process 500 proceeds to step 516 as well, and ends thereafter.

The components in the block diagrams and the steps in the flowcharts described above are described only as examples. The components and the steps have been selected for the clarity of the description and are not limiting on the illustrative embodiments of the invention. For example, a particular implementation may combine, omit, further subdivide, modify, augment, reduce, or implement alternatively, any of the components or steps without departing from the scope of the illustrative embodiments. Furthermore, the steps of the processes described above may be performed in a different order within the scope of the invention.

Thus, a computer implemented method, apparatus, and computer program product are provided in the illustrative embodiments for automated planning in physical synthesis. Using an embodiment of the invention, a design of an integrated circuit can be improved using solutions that may include a manipulation that, in isolation, may deteriorate the quality of the design. An embodiment is not limited in the manipulations that can be performed or components that can be manipulated at the onset of the automated planning process, rather the embodiment may select new operations and components as may be suitable at a given state of the design.

Thus, an embodiment is capable of exploring a solution space comprising arbitrarily complex and nested design transformations. An embodiment may achieve improved solution-reachability in cases where a sequence of manipulations is required to achieve a design improvement.

The invention can take the form of an entirely software embodiment, or an embodiment containing both hardware and software elements. In a preferred embodiment, the invention is implemented in software or program code, which includes but is not limited to firmware, resident software, and microcode.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Further, a computer storage medium may contain or store a computer-readable program code such that when the computer-readable program code is executed on a computer, the execution of this computer-readable program code causes the computer to transmit another computer-readable program code over a communications link. This communications link may use a medium that is, for example without limitation, physical or wireless.

A data processing system suitable for storing and/or executing program code will include at least one processor coupled directly or indirectly to memory elements through a system bus. The memory elements can include local memory employed during actual execution of the program code, bulk storage media, and cache memories, which provide temporary storage of at least some program code in order to reduce the number of times code must be retrieved from bulk storage media during execution.

A data processing system may act as a server data processing system or a client data processing system. Server and client data processing systems may include data storage media that are computer usable, such as being computer readable. A data storage medium associated with a server data processing system may contain computer usable code. A client data processing system may download that computer usable code, such as for storing on a data storage medium associated with the client data processing system, or for using in the client data processing system. The server data processing system may similarly upload computer usable code from the client data processing system. The computer usable code resulting from a computer usable program product embodiment of the illustrative embodiments may be uploaded or downloaded using server and client data processing systems in this manner.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to explain the principles of the invention, the practical application, and to enable others of ordinary skill in the art to understand the invention for various embodiments with various modifications as are suited to the particular use contemplated.

What is claimed is:

1. A computer implemented method for automated planning in physical synthesis of a design of an integrated circuit, comprising:
    identifying, in an application executing in a computer, a first state of the design, wherein the first state is a representation of a particular configuration of circuit components having a particular electrical characteristic;
    selecting from a library, a first operation applicable to the first state;
    applying the first operation to reach a second state of the design;
    analyzing a consequence of reaching the second state; and
    responsive to the consequence indicating an improvement in the design, presenting a solution to achieve the improvement, the solution including manipulations of design components using a set of operations to reach the second state from the first state.

2. The computer implemented method of claim 1, further comprising: selecting a second operation dependent upon the consequence of reaching the second state to reach a third state of the design from the second state.

3. The computer implemented method of claim 1, further comprising: responsive to reaching a maximum level depth without the consequence indicating the improvement, retracting to the first state and attempting a third operation to reach a third state from the first state.

4. The computer implemented method of claim 1, wherein an operation is added for consideration as a second operation after the first operation has been executed.

5. The computer implemented method of claim 1, wherein a second operation to reach a third state from the second state is performed using a component that was not present in the design at the first state.

6. The computer implemented method of claim 1, further comprising:
    creating a set of operations, the set of operations including the first operation, wherein a total number of operations in the set is limited by a maximum depth level.

7. The computer implemented method of claim 1, wherein a progression from the first state to the second state occurs in an iterative deepening mode.

8. The computer implemented method of claim 1, wherein a progression from the first state to the second state occurs in a look ahead mode.

9. A computer usable program product comprising a computer usable storage device including computer usable code to be executed by a processor for automated planning in physical synthesis of a design of an integrated circuit, the computer usable code comprising:
    computer usable code for identifying, in an application executing in a computer, a first state of the design, wherein the first state is a representation of a particular configuration of circuit components having a particular electrical characteristic;
    computer usable code for selecting from a library, a first operation applicable to the first state;
    computer usable code for applying the first operation to reach a second state of the design;
    computer usable code for analyzing a consequence of reaching the second state; and
    computer usable code for, responsive to the consequence indicating an improvement in the design, presenting a solution to achieve the improvement, the solution including manipulations of design components using a set of operations to reach the second state from the first state.

10. The computer usable program product of claim 9, further comprising:
computer usable code for selecting a second operation dependent upon the consequence of reaching the second state to reach a third state of the design from the second state.

11. The computer usable program product of claim 9, further comprising:
computer usable code for, responsive to reaching a maximum level depth without the consequence indicating the improvement, retracting to the first state and attempting a third operation to reach a third state from the first state.

12. The computer usable program product of claim 9, wherein an operation is added for consideration as a second operation after the first operation has been executed.

13. The computer usable program product of claim 9, wherein a second operation to reach a third state from the second state is performed using a component that was not present in the design at the first state.

14. The computer usable program product of claim 9, further comprising:
computer usable code for creating a set of operations, the set of operations including the first operation, wherein a total number of operations in the set is limited by a maximum depth level.

15. The computer usable program product of claim 9, wherein a progression from the first state to the second state occurs in an iterative deepening mode.

16. The computer usable program product of claim 9, wherein a progression from the first state to the second state occurs in a look ahead mode.

17. The computer usable program product of claim 9, wherein the computer usable code is stored in a computer readable storage device in a data processing system, and wherein the computer usable code is transferred over a network from a remote data processing system.

18. The computer usable program product of claim 9, wherein the computer usable code is stored in a computer readable storage device in a server data processing system, and wherein the computer usable code is downloaded over a network to a remote data processing system for use in a computer readable storage device associated with the remote data processing system.

19. A data processing system for automated planning in physical synthesis of an integrated circuit, the data processing system comprising:
a storage device including a storage medium, wherein the storage device stores computer usable program code; and
a processor, wherein the processor executes the computer usable program code, and wherein the computer usable program code comprises:
computer usable code for identifying, in an application executing in a computer, a first state of the design, wherein the first state is a representation of a particular configuration of circuit components having a particular electrical characteristic;
computer usable code for selecting from a library, a first operation applicable to the first state;
computer usable code for applying the first operation to reach a second state of the design;
computer usable code for analyzing a consequence of reaching the second state; and
computer usable code for, responsive to the consequence indicating an improvement in the design, presenting a solution to achieve the improvement, in the solution including manipulations of design components using a set of operations to reach the second state from the first state.

20. The data processing system of claim 19, further comprising: computer usable code for selecting a second operation dependent upon the consequence of reaching the second state to reach a third state of the design from the second state.

* * * * *